United States Patent [19]

Boudon

[11] Patent Number: 4,864,469
[45] Date of Patent: Sep. 5, 1989

[54] SUPPORT STRUCTURE
[75] Inventor: Douglas M. Boudon, Hubbard, Oreg.
[73] Assignee: Tektronix, Inc., Beaverton, Oreg.
[21] Appl. No.: 179,613
[22] Filed: Apr. 11, 1988
[51] Int. Cl.⁴ ............................................. H05K 1/14
[52] U.S. Cl. .................................................. 361/395
[58] Field of Search ............... 361/380, 395, 399, 419, 361/420, 429

[56] References Cited

U.S. PATENT DOCUMENTS 4,679,728 7/1987 Gregory ............................. 361/395

Primary Examiner—Roy N. Envall, Jr.
Attorney, Agent, or Firm—John P. Dellett; William K. Bucher; Robert S. Hulse

[57] ABSTRACT

An integrated support structure provides for improved mounting of components such as circuit boards, disk drives, power supplies, and the like. The structure includes an upper frame and a lower frame hinged together and having cooperative elements for capturing components therebetween as the upper frame and lower frame are brought adjacent to one another in parallel relation. A sliding guide and bridge beam clip secure a disk drive to the structure while a hook and spring latch mount a power supply. The frames are suitably formed by structural foam injection molding and the components are secured to the structure without the need for screws. The entire assembly may be inserted in a shell or case for protection thereof. The overall configuration allows rapid assembly for production and rapid disassembly for service.

10 Claims, 3 Drawing Sheets

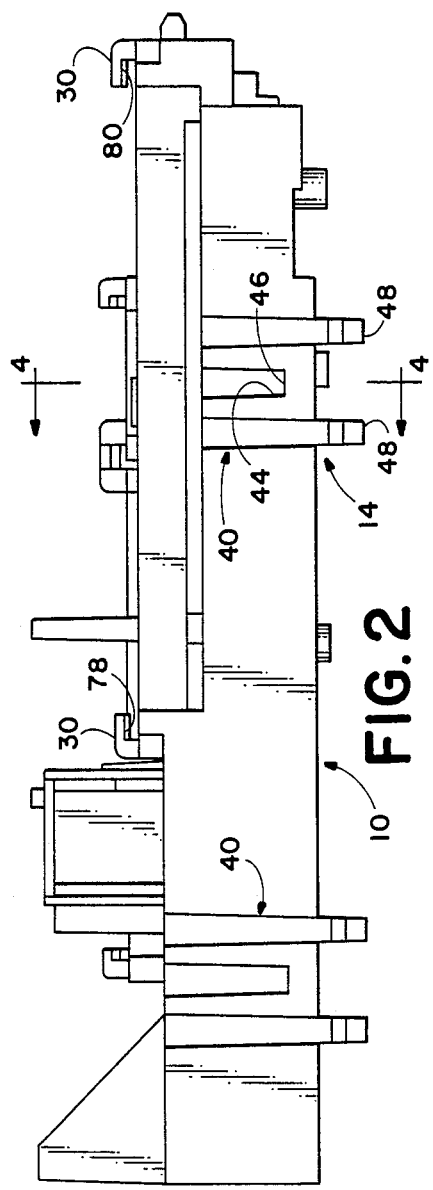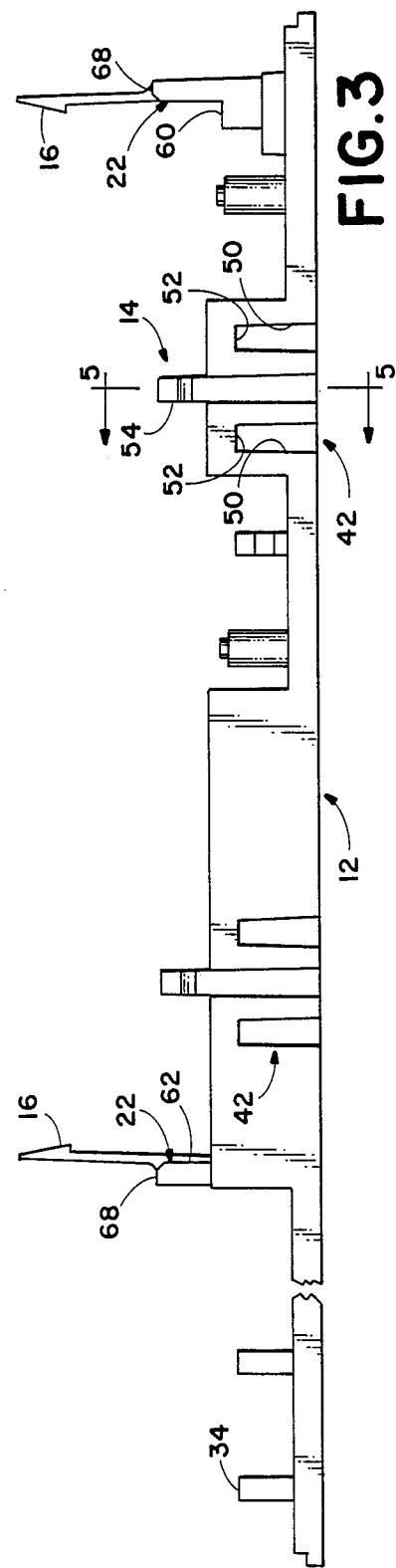

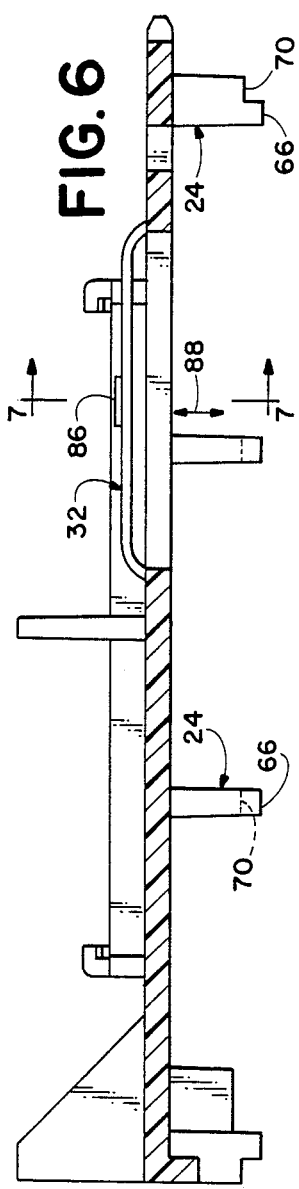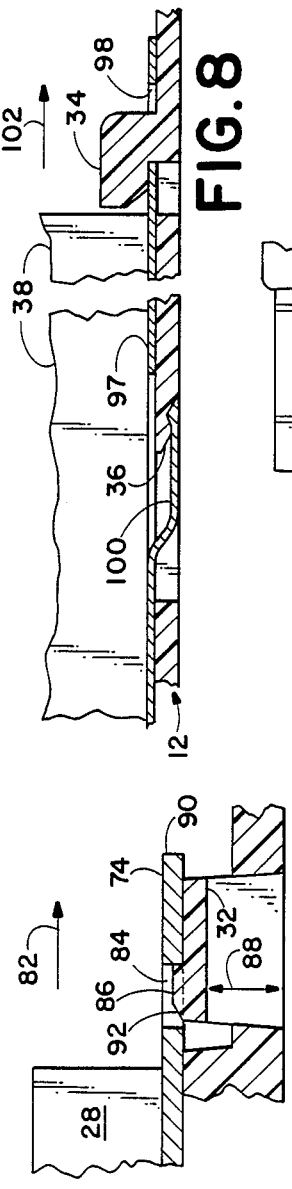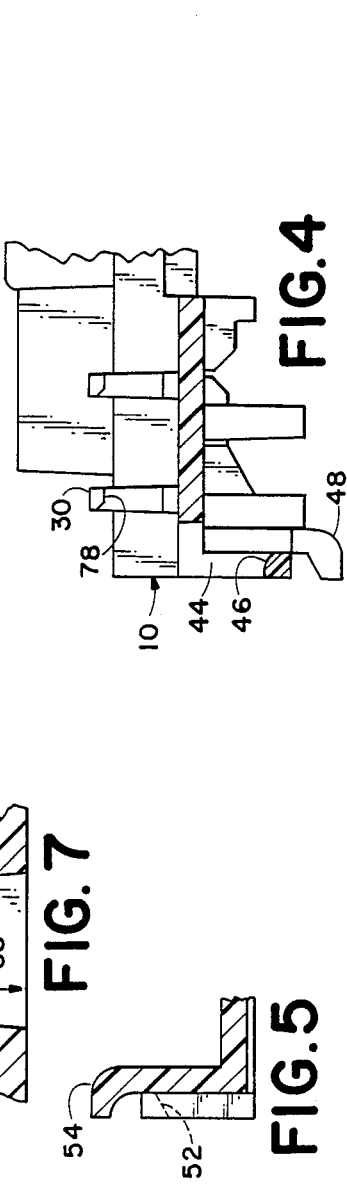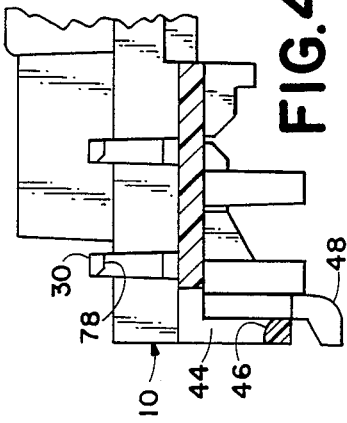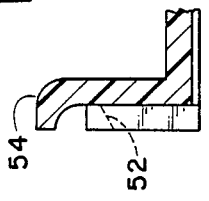

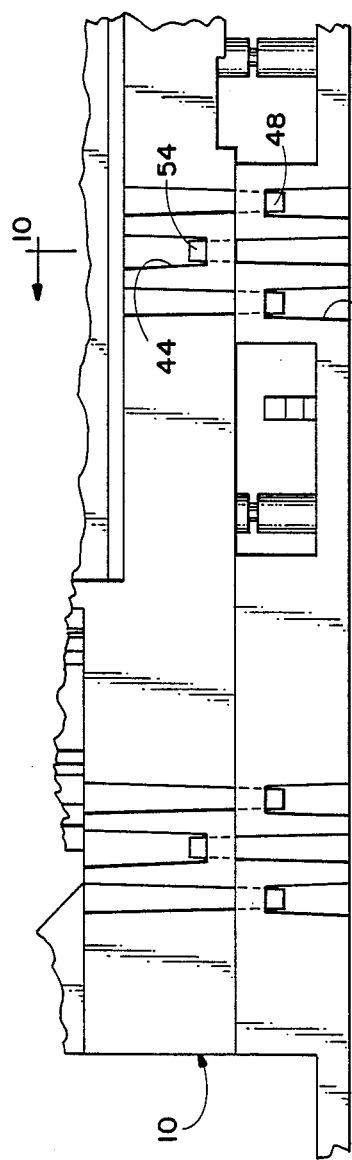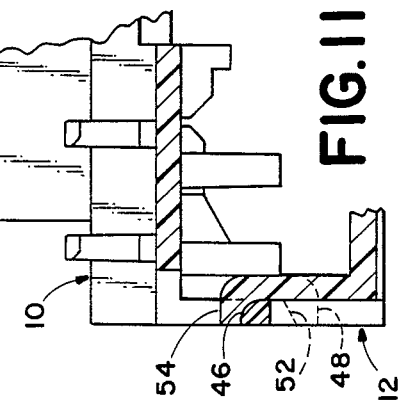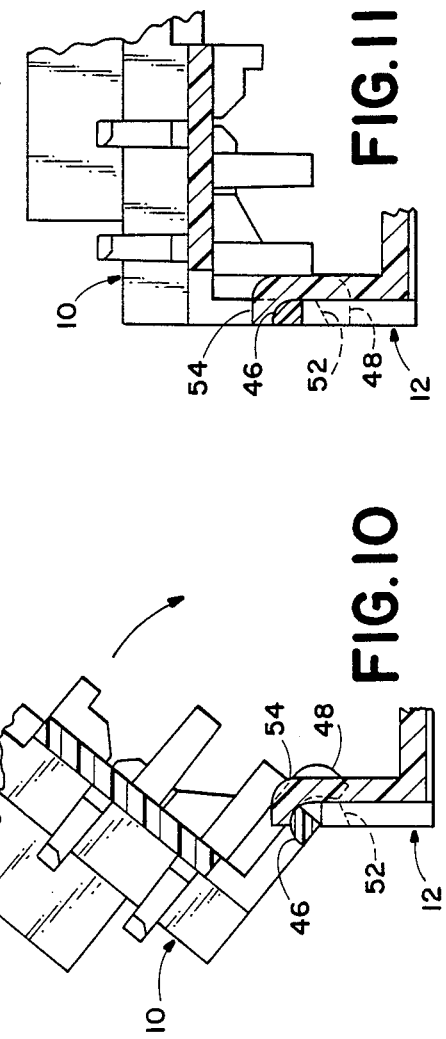

SUPPORT STRUCTURE

BACKGROUND OF THE INVENTION

The present invention relates generally to support structures and particularly to support structures for mounting components without the use of screws.

Support structures for computer related products must typically provide for mounting of interconnected components such as disk drives, circuit boards, and power supplies. It is desirable that such structures allow for rapid mounting and removal of components. Heretofore, support structures have taken a box-like form having mounting elements within the box. Components are secured to the mounting elements by use of fasteners such as screws. A lid may be used to close the box and protect the components.

SUMMARY OF THE INVENTION

In accordance with a principal embodiment of the present invention, an improved support structure for mounting interconnected components is produced by structural foam injection molding and includes a first frame and a second frame coupled in hinged relation and retained in confronting relation by snap latch clips. Each frame includes formations adapted to closely receive and capture components as the frames are brought together and secured in confronting relation. A hook and a spring latch keeper integral to the structure cooperate with a slot and spring latch of a first component to be secured to the structure while a resilient bridge beam clip having a catch engages a slot portion of a second component to be mounted. The entire assembly may be inserted in a case for protection.

Accordingly, it is an object of the present invention to provide a support structure for mounting components without the need for screws and the like and thereby facilitate rapid assembly and disassembly.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 2 is a side view of an upper frame of the support structure of FIG. 1 taken along lines 2—2 of FIG. 1;

FIG. 3 is a side view of a lower frame of the support structure of FIG. 1 taken along lines 3—3 of FIG. 1;

FIG. 4 is a cross sectional view of the upper frame taken along lines 4—4 of FIG. 2 and illustrating a portion of a pass core interlock for coupling the upper frame and the lower frame;

FIG. 5 is a cross sectional view of the lower frame taken along lines 5—5 of FIG. 3 and illustrating a portion of the pass core interlock complimentary to that shown in FIG. 5;

FIGS. 6 and 7 are cross sectional views of a bridge beam clip with FIG. 6 taken along lines 6—6 of FIG. 1;

FIG. 8 is a cross sectional view of the support structure of FIG. 1 taken along lines 8—8 of FIG. 1 and showing a hook and spring latch mounting arrangement; and FIGS. 9-11 show the support structure in various stages of assembly.

DETAILED DESCRIPTION

Figure 1:
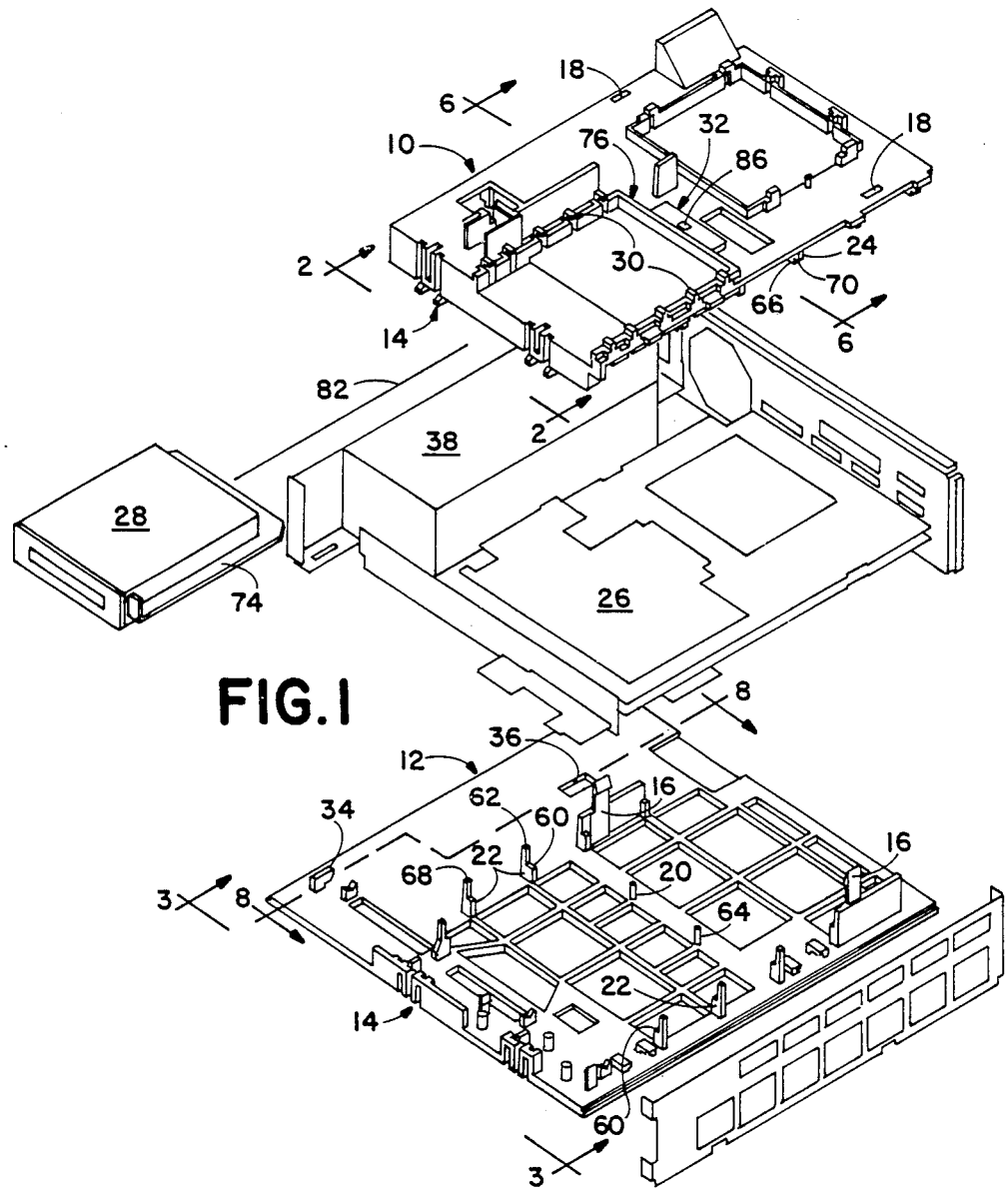
FIG. 1 is an exploded perspective view of a support structure according to a principal embodiment of the present invention and components for mounting to said structure.

In accordance with a principal embodiment of the present invention, a support structure includes an upper frame 10 and a lower frame 12 each formed by a structural foam injection molding process. A polyphenylene ether copolymer, produced by Borg Warner, is used as the frame material. Pass core design is used in the die tooling for the upper frame 10 and lower frame 12 to provide complementary interlocks 14 for coupling upper frame 10 and lower frame 12 in hinged relation. Snap latches 16 are formed in the lower frame 12 and received in corresponding snap latch keepers 18 in the upper frame 10 when the frames are pivoted on interlocks 14 and brought into confronting relation. Snap latches 16 and keepers 18 thereby secure the frames in confronting relation. A circuit board package 26, which may comprise a single circuit board or multiple circuit boards suitably interconnected to form a single package, is captured by posts 20 and 22 on lower frame 12 and posts 24 on the upper frame 10 capture circuit board package 26 between upper frame 10 and lower frame 12. A disk drive 28 is slidable upon slide mounts 30 on upper frame 10, while a bridge beam clip 32 engages a slot on drive 28 to secure drive 28 to frame 10. A hook 34 and latch detail 36 in lower frame 12 secure a power supply 38 to the support structure.

It will be appreciated that the circuit board package 26, disk drive 28, and power supply 38 are secured to the integrated support structure without the use of screws. The components 26, 28, and 38 are easily and quickly mounted to and removed from the support structure for convenient assembly and service of the components.

Referring to FIGS. 2-4, interlocks 14 include two double hook details 40 on upper frame 10 (FIGS. 2 and 4) and two corresponding single hook details 42 on lower frame 12 (FIGS. 3 and 5) which cooperate to couple upper frame 10 and lower frame 12 in hinged relation. Each hook detail 40 includes an aperture 44 defining a hook seat 46 between hooks 48, while each single hook detail 42 includes apertures 50 defining hook seats 52 on each side of hook 54. Frames 10 and 12 are hinged by inserting hooks 54 in respective apertures 44 and hooks 48 in respective apertures 50.

As frames 10 and 12 are pivoted toward confronting relationship, as seen in FIG. 10, hooks 54 engage hook seats 46 respectively while hooks 48 engage hook seats 52 respectively. When the frames are in confronting relationship, as seen in FIGS. 9 and 11, interlocks 14 secure frames 10 and 12 against substantially all relative movement except for pivotal movement about interlocks 14. As shown in FIG. 1, each snap latch 16 engages a corresponding latch keeper 18 as frames 10 and 12 come together to secure frames 10 and 12 against pivotal movement about interlocks 14. In this manner, frames 10 and 12 are held in confronting relation until such time that snap latch details 16 are released from keeper details 18.

As shown in FIGS. 1 and 3, each post 22 on lower frame 12 includes a horizontal land 60 for supporting circuit board package 26 from below against downward vertical movement and an upright 62 for holding circuit board package 26 against horizontal or lateral movement, there being at least one such post 22 positioned at each edge of circuit board package 26 such that package 26 is held against substantially all but upward vertical movement. Posts 22 are suitably positioned and sized to accommodate the particular dimensions of the package 26. Posts 20 (FIG. 1) are cylindrical and provide additional lands 64 for vertical support of package 26.

Each post 24 (FIGS . 1 and 6) on upper frame 10 corresponds to one of posts 22 and includes a land 66 for engaging a portion of circuit board package 26 opposite that engaged by the corresponding land 60, the separation between lands 60 and lands 66 corresponding to the thickness of the package 26. Each post 22 further includes an upper land 68 (FIG. 3) for engaging a second land 70 on a corresponding one of posts 24, lands 68 and 70 being brought into direct contact as frames 10 and 12 come together in confronting relation. Thus, posts 22 and 24 serve to capture circuit board package 26 between frames 10 and 12, and further, establish points of contact therebetween. To mount circuit board package 26, the package is placed on lands 60, and frames 10 and 12 are brought together until lands 70 contact lands 68 substantially concurrently with the engagement of snap latches 16 within keepers 18.

Referring now to FIGS. 1, 2, 4, 6 and 7, disk drive 28 is carried on a planar support 74 and slidably received by slide mounts 30 on upper frame 10. Slide mounts 30 are positioned on the left and right sides of a disk mount site 76, and define left and right channels 78 and 80 through which the left and right edges respectively of planar support 74 slide. Thus, disk drive 28 is inserted in channels 78 and 80 and travels therein along a selected path 82 until disk drive 28 is suitably positioned at disk mount site 76. Stops (not shown) may be provided to limit further travel of drive 28 at a specific point on path 82 and thereby define the mounting position on path 82. Bridge beam clip 32 lies adjacent to selected path 82 and next to disk mount site 76. A leading edge of planar support 74 includes a slot 84 which engages a catch 86 atop bridge beam clip 32 as disk drive 28 reaches its mounting position. Thus, slide mounts 30 restrict the motion of disk drive 28 to motion along selected path 82, while slot 84 and bridge beam clip 32 secure drive 28 at a suitable location along selected path 82.

It will be appreciated that bridge beam clip 32 is a beam structure supported at its ends and therefore provides suitable resilience at its midpoint in directions indicated by arrow 88. Thus, with specific reference to FIG. 7, as leading edge 90 of planar support 74 first engages inclined portion 92 of catch 86, bridge beam clip 32 gives way and permits support 74 to pass over until such time that slot 84 allows bridge beam clip 32 to rebound and force catch 86 into slot 84. Disk drive 28 is then held in its mounting position until catch 86 is pushed out of slot 84 and drive 28 is slid away from bridge beam clip 32.

Referring now to FIGS. 1 and 8, power supply 38 comprises a sheet metal housing having a bottom wall 97. Wall 97 includes a slot 98 at a forward portion thereof and a spring latch 100 at a rearward portion. To mount power supply 38 upon lower frame 12, spring latch 100 is inserted in keeper 36 while hook 34 is inserted in slot 98. As power supply 38 is moved in relation to frame 12 in a direction indicated by arrow 102, keeper 36 captures spring latch 100 and prevents movement opposite of that indicated by arrow 102, while hook 34 restricts further movement along path 102.

Power supply 38 is also held against movement transverse to path 102 by the hook 34 and latch 100 arrangement. Power supply 38 is thereby secured to frame 12 until spring latch 100 is released from keeper 36 and supply 38 is moved in a direction opposite that of path 102.

While a preferred embodiment of the present invention has been shown and described, it will be apparent to those skilled in the art that many changes and modifications may be made without departing from the invention in its broader aspects. For example, while structural foam is the preferred frame material, other structural polymers suitable for injection molding could be used depending on the particular application. Further, aspects of the present invention could be implemented through die casting using metallic material such as zinc and the like. The appended claims are therefore intended to cover all such changes and modifications as fall within the true spirit and scope of the invention.

I claim:

1. A support structure comprising:
   a first frame member having a first hinge portion adjacent to the periphery thereof;
   a second frame member having a second hinge portion adjacent to the periphery thereof, the second hinge portion being complementary to and coextensive with the first hinge portion, the first and second frame member being movable into confronting relationship to each other about the first and second hinge portions;
   means for securing the first and second frame members in a confronting relationship; and
   means for capturing an electrical component within the support structure during movement of the first and second frame members into a confronting relationship.

2. The support structure according to claim 1 wherein the securing means comprises:
   a snap latch formed in one of the frames members; and
   a snap latch keeper formed in the other frame member, the snap latch keeper receiving and retaining the snap latch as the first and second frame members are brought together in confronting relationship.

3. The support structure according to claim 1 wherein the capturing means comprises:
   a first post formed in one of the frame members, the first post having a land for supporting the electrical component ; and
   a second post formed in the other frame member, the second post having a land coextensive with the land of the first post for capturing the electrical component there between during movement of the first and second frame members into the confronting relationship.

4. The support structure according to claim 1 wherein the first and second hinge portions further comprise respective first and second complementary interlocks each having a hook and a hook seat, the hook of the first interlock corresponding to the hook seat of the second interlock and the hook of the second interlock corresponding to the hook seat of the first interlock, the hooks engaging corresponding hook seats during pivotal movement of the frame members about the interlocks preventing relative linear movement of the frame members while permitting relative pivotal movement therebetween.

5. The support structure of claim 1 wherein the first and second frame members, the positioning means, the securing means, and the capturing means comprise a material of polyphenylene ether copolymer.

6. The support structure according to claim 2 wherein the snap latch and the snap latch keeper comprise structures integrally formed to the first and second frame members.

7. The support structure of claim 3 wherein the first and second posts comprise structures integrally formed in respective first and second frame members.

8. In combination, a support structure and a component such as a disk drive or the like, to be secured at a mounting location upon the support structure, the support structure comprising means for receiving said component in sliding fashion by restricting movement of said component to movement along a selected path, and a bridge beam having a first retention formation, and the component having a second retention formation, the second retention formation being engageable with the first retention formation for coupling said component and said bridge beam to secure said component at the mounting location.

9. The structure according to claim 8, wherein said second retention formation includes a slot and said first retention formation comprises:
a catch affixed to said bridge beam, said bridge beam being resilient in a direction transverse to the selected path, and the catch being positioned to enter the slot as said component reaches the mounting location.

10. The structure according to claim 8 wherein said structure is formed by a structural foam injection molding process, said receiving means, said bridge beam, and said retention means being formed thereby as integral elements of said structure.

* * * * *